(12) United States Patent
Chaffins et al.

(10) Patent No.: US 11,001,000 B2
(45) Date of Patent: May 11, 2021

(54) THREE-DIMENSIONAL (3D) PRINTING

(71) Applicant: Hewlett-Packard Development Company, L.P., Houston, TX (US)

(72) Inventors: Sterling Chaffins, Corvallis, OR (US); Kevin P. DeKam, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 330 days.

(21) Appl. No.: 15/763,231

(22) PCT Filed: Oct. 21, 2015

(86) PCT No.: PCT/US2015/056692
§ 371 (c)(1),
(2) Date: Mar. 26, 2018

(87) PCT Pub. No.: WO2017/069752
PCT Pub. Date: Apr. 27, 2017

(65) Prior Publication Data
US 2018/0272607 A1    Sep. 27, 2018

(51) Int. Cl.
*B05D 1/02* (2006.01)
*B05D 1/04* (2006.01)
(Continued)

(52) U.S. Cl.
CPC .............. *B29C 64/30* (2017.08); *B28B 1/001* (2013.01); *B29C 64/153* (2017.08); *B29C 64/165* (2017.08); *B33Y 10/00* (2014.12); *B33Y 40/10* (2020.01); *B33Y 70/00* (2014.12); *B33Y 80/00* (2014.12); *H05K 1/092* (2013.01); *H05K 3/10* (2013.01); *B05D 7/50* (2013.01);
(Continued)

(58) Field of Classification Search
CPC ... B05D 1/02; B05D 1/04; B05D 1/18; B05D 7/50; B05D 7/52; B05D 7/56; B05D 2350/60; B28B 1/001; B29C 64/153; B29C 64/165; B29C 64/30; B29C 71/02; B29C 71/04; B33Y 10/00; B33Y 40/10; B33Y 70/00; C08J 7/04; C08J 7/042; C09D 11/00; C09D 11/02; C09D 11/03; C09D 11/033; C09D 11/037; C09D 11/10; C09D 11/101; C09D 11/30; C09D 11/32; C09D 11/322; C09D 11/328
USPC ....... 264/113, 129, 236, 308, 460, 461, 462, 264/463, 497; 427/404, 412.1, 419.1, 427/419.2
See application file for complete search history.

(56) References Cited

U.S. PATENT DOCUMENTS

| | | | | |
|---|---|---|---|---|
| 4,844,954 A | * | 7/1989 | Taylor | B05D 5/068 427/419.1 X |
| 6,020,175 A | * | 2/2000 | Onda | C07K 17/04 435/174 |

(Continued)

FOREIGN PATENT DOCUMENTS

| | | |
|---|---|---|
| EP | 1415792 | 4/2014 |
| JP | H08300492 | 11/1996 |

*Primary Examiner* — Leo B Tentoni
(74) *Attorney, Agent, or Firm* — Dierker & Kavanaugh PC

(57) ABSTRACT

In a three-dimensional printing method example, a pre-treatment coating is formed on a part precursor by applying and drying, alternatingly: a polycation solution including a chloride ion and a polyanion solution including a sodium ion to form at least two layers. An ink is selectively deposited on the pre-treatment coating.

12 Claims, 5 Drawing Sheets

(51) Int. Cl.

| | | |
|---|---|---|
| B05D 1/18 | (2006.01) | |
| B29C 71/02 | (2006.01) | |
| B29C 71/04 | (2006.01) | |
| C08J 7/04 | (2020.01) | |
| C09D 11/00 | (2014.01) | |
| C09D 11/02 | (2014.01) | |
| C09D 11/03 | (2014.01) | |
| C09D 11/033 | (2014.01) | |
| C09D 11/037 | (2014.01) | |
| C09D 11/10 | (2014.01) | |
| C09D 11/101 | (2014.01) | |
| C09D 11/30 | (2014.01) | |
| C09D 11/32 | (2014.01) | |
| C09D 11/322 | (2014.01) | |
| C09D 11/328 | (2014.01) | |
| B29C 64/30 | (2017.01) | |
| B33Y 80/00 | (2015.01) | |
| B29C 64/165 | (2017.01) | |
| B33Y 40/10 | (2020.01) | |
| B28B 1/00 | (2006.01) | |
| B33Y 10/00 | (2015.01) | |
| B33Y 70/00 | (2020.01) | |
| B29C 64/153 | (2017.01) | |
| H05K 1/09 | (2006.01) | |
| H05K 3/10 | (2006.01) | |
| B05D 7/00 | (2006.01) | |
| B29K 77/00 | (2006.01) | |

(52) U.S. Cl.
CPC ............... $B05D$ $7/52$ (2013.01); $B05D$ $7/56$ (2013.01); $B05D$ $2350/60$ (2013.01); $B29K$ $2077/00$ (2013.01); $C08J$ $7/042$ (2013.01)

(56) References Cited

U.S. PATENT DOCUMENTS

| | | |
|---|---|---|
| 7,049,363 B2 | 5/2006 | Shen |
| 7,251,893 B2 | 8/2007 | Cohen et al. |
| 7,309,728 B2 | 12/2007 | Kasperchik |
| 7,744,644 B2 | 6/2010 | Weber et al. |
| 7,795,349 B2 | 9/2010 | Bredt et al. |
| 8,834,988 B2 | 9/2014 | Bauer et al. |
| 2001/0048975 A1* | 12/2001 | Winterton ............ G02B 1/043 427/412.1 |
| 2005/0080191 A1 | 4/2005 | Kramer et al. |
| 2007/0238056 A1 | 10/2007 | Baumann et al. |
| 2009/0152771 A1 | 6/2009 | Philippi et al. |
| 2009/0181227 A1* | 7/2009 | Hazlewood .......... C09D 11/101 428/209 |
| 2016/0144091 A1* | 5/2016 | Breedon ............... A61F 2/0036 264/129 X |

\* cited by examiner

THREE-DIMENSIONAL (3D) PRINTING

BACKGROUND

Three-dimensional (3D) printing may be an additive printing process used to make three-dimensional solid parts from a digital model. 3D printing is often used in rapid product prototyping, mold generation, and mold master generation. Some 3D printing techniques are considered additive processes because they involve the application of successive layers of material. This is unlike traditional machining processes, which often rely upon the removal of material to create the final part. Materials used in 3D printing often require curing or fusing, which for some materials may be accomplished using heat-assisted extrusion or sintering, and for other materials may be accomplished using digital light projection technology.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Figure 1:
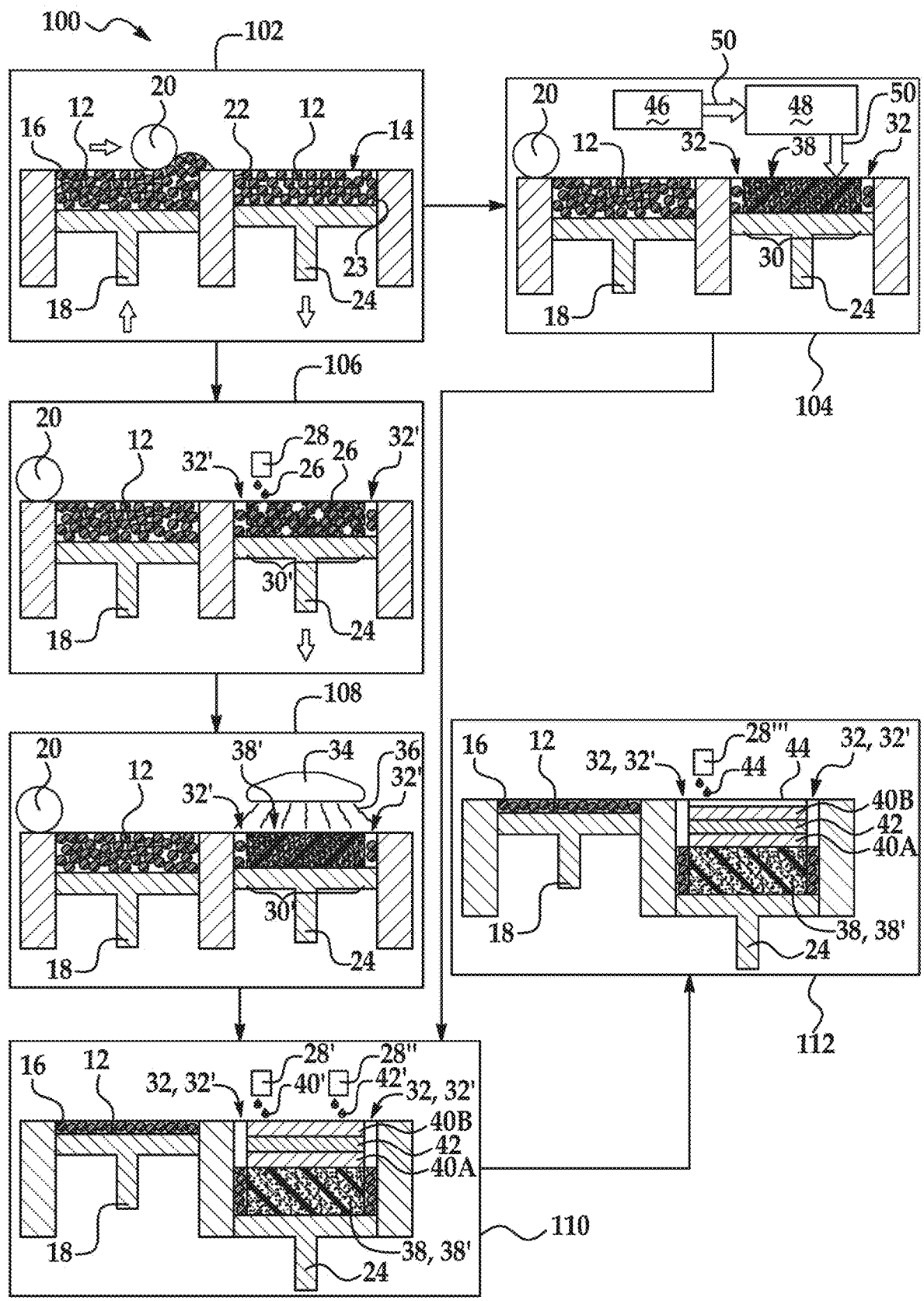
FIG. 1 is a flow diagram illustrating an example of a 3D printing method disclosed herein.

Examples of the three-dimensional (3D) printing method disclosed herein utilize Selective Laser Sintering (SLS) or Multi Jet Fusion (MJF). During selective laser sintering, a laser beam is aimed at a selected region (in some instances less than the entire layer) of a layer of a build material (also referred to as build material particles). Heat from the laser beam causes the build material under the laser beam to melt or sinter. This causes the build material to fuse, bind, cure, etc. to form the layer of the 3D part. During multi jet fusion, an entire layer of a build material is exposed to radiation, but a selected region (in some instances less than the entire layer) of the build material is fused and hardened to become a layer of a 3D part. In the examples disclosed herein, a fusing agent is selectively deposited in proximity to the selected region of the build material. The fusing agent(s) is capable of penetrating into the layer of the build material and spreading onto the exterior surface of the build material. This fusing agent is capable of absorbing radiation and converting the absorbed radiation to thermal energy, which in turn melts or sinters the build material that is in contact with the fusing agent. This causes the build material to fuse, bind, cure, etc. to form the layer of the 3D part.

3D-printed parts tend to be porous and have a high surface roughness. As a result, ink printed on 3D-printed parts tends to have poor print quality (e.g., image bleed) and/or poor sheet resistance (e.g., poor conductivity). Examples of the method disclosed herein utilize a pre-treatment coating formed from oppositely charged polyelectrolytes to improve print quality (e.g., reduce bleed) and/or sheet resistance (e.g., conductivity). The pre-treatment coating provides a more suitable surface (e.g., than an untreated 3D printed part) upon which to apply colored or conductive ink. It is believed that the pre-treatment coating "crashes" the colorant and/or conductive material out of the ink onto the substrate surface and prevents distribution of the colorant and/or conductive material into the substrate through wicking or capillary action, which enables a higher concentration of the colorant and/or conductive material in the applied area. Additionally, the pre-treatment coating may plug some of the pores in the 3D printed part. It is also believed that the sodium and chloride in the polycation and polyanion solutions (respectively) may assist the self-sintering mechanism of some conductive inks. Some colloidal metal dispersions must form an amalgamate (i.e., a connected structure) as the ink dries in order to effectively conduct electricity. The sodium and chloride functionalities in the polycation and polyanion solutions (respectively) may speed up this self-sintering process, which may be desirable if the 3D printing process does not allow a slow drying ink to complete this reaction (e.g., because of a heated fabrication bed or heated 3D printing environment).

The pre-treatment coating is formed by applying and drying, alternatively: i) a polycation solution including a chloride ion and ii) a polyanion solution including a sodium ion to form at least two layers. In some examples of the method, the pre-treatment coating is applied to an already sintered or fused build material. The build material may be purchased already sintered or fused from a manufacturer (e.g., Stratasys) or may be sintered or fused prior to applying the pre-treatment coating. In some other examples, the pre-treatment coating is applied before sintering or fusing the build material. In any of the example methods, an ink may be applied to the pre-treatment coating. The ink may be colored and/or conductive.

Examples of the 3D part include a sintered or fused substrate, a multi-layer pre-treatment coating on the sintered or fused substrate, and an ink applied to at least a portion of the multi-layer pre-treatment coating. The multi-layer pre-treatment coating includes a polycation layer and a polyanion layer. The ink may be any color. The ink may be conductive and may form a conductive dement on the 3D part.

As used herein "3D printed part" or "part" may be a completed 3D printed part or a layer of a 3D printed part. As used herein "part precursor" may be any part at any stage of formation or a fully formed part. For example, "part precursor" may refer to a fully formed substrate formed by multi jet fusion or selective laser sintering without the pre-treatment coating thereon.

An example of the 3D printing method 100 is depicted in FIG. 1. As an example, the method 100 may be used to apply color to a part precursor 38, 38'. As another example, the method 100 may be used to form a conductive element on a part precursor 38, 38'.

As shown at reference numeral 102, the method 100 includes applying a build material 12. One layer 14 of the build material 12 has been applied.

The build material 12 may be a powder, a liquid, a paste, or a gel. The build material 12 may be a polymeric material, may be a composite material of polymer and ceramic, or may be a composite material of polymer and metal. Examples of polymeric build material 12 include semi-crystalline thermoplastic materials with a wide processing window of greater than 5° C. (i.e., the temperature range between the melting point and the re-crystallization temperature). Some specific examples of the polymeric build material 12 include polyamides (PAs) (e.g., PA 11/nylon 11, PA 12/nylon 12, PA 6/nylon 6, PA 8/nylon 8, PA 9/nylon 9, PA 66/nylon 66, PA 612/nylon 612, PA 812/nylon 812, PA 912/nylon 912, etc.). Other specific examples of the polymeric build material 12 include polyethylene, polyethylene terephthalate (PET), and an amorphous variation of these materials. Still other examples of suitable polymeric build materials 12 include polystyrene, polyacetals, polypropylene, polycarbonate, polyester, thermal polyurethanes, other engineering plastics, and blends of any two or more of the polymers listed herein. Core shell polymer particles of these materials may also be used.

Any of the previously listed polymeric build materials 12 may be combined with ceramic particles to form the polymer and ceramic composite build material 12. The ratio of polymer particles to ceramic particles will depend on the polymer panicles used and the ceramic particles used, and may depend upon the infrared absorbing properties of the resulting composite material. In one example, the ratio of polymer panicles to ceramic particles is 1:1. Examples of suitable ceramic particles include metal oxides, inorganic glasses, carbides, nitrides, and borides. Some specific examples include alumina ($Al_2O_3$), glass, silicon mononitride (SiN), silicon dioxide ($SiO_2$), zirconia ($ZrO_2$), titanium dioxide ($TiO_2$), or combinations thereof.

Any of the previously listed polymeric build materials 12 may be combined with metal particles to form the polymer and metal composite build material 12. The ratio of polymer particles to metal particles will depend on the polymer particles used and the metal particles used. In one example, the amount of metal particles is less than 11% by volume based on the total volume of the build material 12. Examples of suitable metal particles include silver (Ag), copper (Cu), zinc (Zn), or steels.

The build material 12 may have a melting point ranging from about 50° C. to about 400° C. This range may vary, depending upon the build material 12 that is used. As examples, the build material 12 may be a polyamide having a melting point of 180° C., or thermal polyurethanes having a melting point ranging from about 100° C. to about 165° C.

The build material 12 may be made up of similarly sized particles or differently sized particles. In the examples shown herein, the build material 12 includes similarly sized particles. The term "size", as used herein with regard to the build material 12, refers to the diameter of a spherical particle, or the average diameter of a non-spherical particle (i.e., the average of multiple diameters across the particle).

In an example, the average size of the particles of the build material 12 ranges from 5 μm to about 100 μm.

It is to be understood that build material 12 may include, in addition to polymer particles, a charging agent, a flow aid, or combinations thereof. Charging agent(s) may be added to suppress tribo-charging. Examples of suitable charging agent(s) include aliphatic amines (which may be ethoxylated), aliphatic amides, quaternary ammonium salts (e.g., behentrimonium chloride orcocamidopropyl betaine), esters of phosphoric acid, polyethylene glycolesters, or polyols. Some suitable commercially available charging agents include HOSTASTAT® FA 38 (natural based ethoxylated alkylamine), HOSTASTAT® FE2 (fatty acid ester), and HOSTASTAT® HS 1 (alkane sulfonate), each of which is available from Clariant Int. Ltd.). In an example, the charging agent is added in an amount ranging from greater than 0 wt. % to less than 5 wt. % based upon the total wt. % of the build material 12.

Flow aid(s) may be added to improve the coating flowability of the build material 12. Flow aid(s) may be particularly beneficial when the particles of the build material 12 are less than 25 μm in size. The flow aid improves the flowability of the build material 12 by reducing the friction, the lateral drag, and the tribocharge buildup (by increasing the particle conductivity). Examples of suitable flow aids include tricalcium phosphate (E341), powdered cellulose (E460(ii)), magnesium stearate (E470b), sodium bicarbonate (E500), sodium ferrocyanide (E535), potassium ferrocyanide (E536), calcium ferrocyanide (E538), bone phosphate (E542), sodium silicate (E550), silicon dioxide (E551), calcium silicate (E552), magnesium trisilicate (E553a), talcum powder (E553b), sodium aluminosilicate (E554), potassium aluminum silicate (E555), calcium aluminosilicate (E556), bentonite (E558), aluminum silicate (E559), stearic acid (E570), or polydimethylsiloxane (E900). In an example, the flow aid is added in an amount ranging from greater than 0 wt. % to less than 5 wt. % based upon the total wt. % of the build material 12.

In the example shown at reference numeral 102, applying the build material includes the use of a supply bed 16 (including a supply of the build material 12), a delivery piston 18, a roller 20, a fabrication bed 22 (having a contact surface 23), and a fabrication piston 24. Each of these physical elements may be operatively connected to a central processing unit (not shown) of the printing system. The central processing unit (e.g., running computer readable instructions stored on a non-transitory, tangible computer readable storage medium) manipulates and transforms data represented as physical (electronic) quantities within the printer's registers and memories in order to control the physical elements to create the part precursor 38, 38'. The data for the selective delivery of the build material 12, the laser beam 50, the fusing agent 26, etc. may be derived from a model of the part precursor 38, 38' to be formed. As an example, the central processing unit may be a microprocessor-based controller that is coupled to a memory, for example via a communications bus (not shown). The memory stores the computer readable instructions. The central processing unit may execute the instructions, and thus may control operation of the system in accordance with the instructions.

The delivery piston 18 and the fabrication piston 24 may be the same type of piston, but are programmed to move in opposite directions. In an example, when a layer of the part precursor 38, 38' is to be formed, the delivery piston 18 may be programmed to push a predetermined amount of the build material 12 out of the opening in the supply bed 16 and the fabrication piston 24 may be programmed to move in the opposite direction of the delivery piston 18 in order to increase the depth of the fabrication bed 22. The delivery piston 18 will advance enough so that when the roller 20 pushes the build material 12 into the fabrication bed 22 and onto the contact surface 23, the depth of the fabrication bed 22 is sufficient so that a layer 14 of the build material 12 may be formed in the bed 22. The roller 20 is capable of spreading the build material 12 into the fabrication bed 22 to form the layer 14, which is relatively uniform in thickness. In an example, the thickness of the layer 14 ranges from about 90 µm to about 110 µm, although thinner or thicker layers may also be used. For example, the thickness of the layer 14 may range from about 50 µm to about 200 µm.

It is to be understood that the roller 20 is a build material distributor that may be replaced by other tools, such as a blade that may be useful for spreading different types of powders, or a combination of a roller and a blade.

The supply bed 16 is one example, and could be replaced with another a hopper or other suitable delivery system to supply the build material 12 to the fabrication bed 22.

While not shown in FIG. 1, the layer 14 of the build material 12 may be exposed to heating after the layer 14 is applied in the fabrication bed 22. Heating is performed to pre-heat the build material 12, and thus the heating temperature may be below the melting point of the build material 12. As such, the temperature selected will depend upon the build material 12 that is used. As examples, the heating temperature may be from about 5° C. to about 50° C. below the melting point of the build material 12. In an example, the heating temperature ranges from about 50° C. to about 400° C. In another example, the heating temperature ranges from about 150° C. to about 170° C.

Pre-heating the layer 14 of the build material 12 may be accomplished using any suitable heat source that exposes all of the build material 12 in the fabrication bed 22 to the heat. Examples of the heat source include a thermal heat source or an electromagnetic radiation source (e.g., infrared (IR), microwave, etc.).

Two variations of the method 100 may take place after the build material 12 is applied at reference numeral 102 and/or after the build material 12 is pre-heated (not shown). In one example, the method 100 may involve selectively applying a laser beam 50 to a portion 30 of the build material 12 in the layer 14 (e.g., reference numeral 104). In another example, the method 100 may involve selectively applying a fusing agent 26 on a portion 30' of the build material 12 in the layer 14 and exposing the build material 12 and fusing agent 26 to radiation 36 (e.g., reference numerals 106 and 108). Each of these examples of the method 100 will be described in more detail below.

In an example, after the build material 12 is applied at reference numeral 102 and/or after the build material 12 is pre-heated (not shown), a laser beam 50 is selectively applied on a portion 30 of the build material 12 in the layer 14, as shown at reference number 104. As illustrated in FIG. 1 at reference numeral 104, the laser beam 50 may be applied using a laser 46 and scanner system 48.

The laser 46 emits light through optical amplification based on the stimulated emission of electromagnetic radiation. The laser 46 emits light coherently (i.e. constant phase difference and frequency), which allows the laser beam 50 to stay narrow over large distances and focus on a small area. The laser 46 may be any laser that emits electromagnetic radiation. In an example, the laser 46 emits electromagnetic wavelengths range from about 100 nm (UV) to about 10 µm. In another example, the laser 46 emits light near-infrared light with wavelengths of about 800 nm. In yet another example, the laser 46 may emit infrared light with wavelengths of about 2 µm. The laser 46 may be a pulse laser (i.e., the optical power appears in pluses). Using a pulse laser allows energy to build between pluses, which enable the laser beam 50 to have more energy. While a single laser 46 is shown in FIG. 1 at reference numeral 104, it is to be understood that multiple lasers may be used. While an example of selective laser sintering is provided, it is to be understood that the process may be varied.

The scanning system 48 allows the laser beam 50 to be selectively applied to those portions 30 of the layer 14 that are to be fused to become one layer of the 3D part precursor 38. The scanning system 48 directs the laser beam 50 according to a pattern of a cross-section for the layer of the 3D part precursor 38 that is to be formed. As used herein, the cross-section of the layer of the 3D part precursor 38 to be formed refers to the cross-section that is parallel to the contact surface 23. As an example, if the first layer is to be shaped like a cube or cylinder, the scanning system 48 will direct the laser beam(s) 50 in a square pattern or a circular pattern (from a top view), respectively, on at least a portion of the layer 14 of the build material 12. In the example shown at reference numeral 104 in FIG. 1, the fusing agent 26 is deposited in a square pattern on the area or portion 30 of the layer 14 and not on the areas or portions 32. The scanning system 48 may be programmed to receive commands from the central processing unit. The central processing unit may transmit to the scanning system 48 a digital description (e.g., CAD file or scan data) of the 3D part precursor 38 to be formed.

The scanning system 48 may be attached to a moving XY stage or a translational carriage (neither of which is shown) that moves the scanning system 48 adjacent to the fabrication bed 22 in order to direct the laser beam 50 in desirable area(s) 30. In other examples, the scanning system 48 may be fixed while a support member (similar to the fabrication bed 22) is configured to move relative thereto.

The length of time the laser beam 50, or energy exposure time, may be dependent on the characteristics of the electromagnetic radiation emitted from the laser 46 and/or the characteristics of the build material 12

The build material 12 absorbs the radiation from the laser beam 50 and converts the radiation to thermal energy. In an example, the laser beam 50 transfers enough energy to the build material 12 to elevate the temperature of the build material 12 above the melting point(s), allowing curing (e.g., sintering, binding, fusing, etc.) of the build material particles 12 to take place. In an example, the temperature is elevated at or above the melting temperature of the build material 12. In an example, the temperature may be elevated up to or even beyond 50° C. above the melting temperature. The laser beam 50 may also cause, for example, heating of the build material 12, below its melting point but to a temperature suitable to cause softening and bonding. It is to be understood that portions 32 of the build material 12 that do not have the laser beam 50 directed thereto do not absorb enough energy to fuse.

While the part precursor 38 is shown as a single layer, it is to be understood that the part precursor 38 may include several layers. Each additional layer of the part precursor 38 may be formed by repeating reference numerals 102 and 104. For example, to form an additional layer of the part precursor, an additional layer of the build material 12 may be applied to the part precursor 38 shown in reference numeral 104 and the additional layer may be selectively exposed to the laser beam 50 to define that additional layer. Any number of additional layers may be formed.

In another example, after the build material 12 is applied at reference numeral 102 and/or after the build material 12 is pre-heated (not shown), the fusing agent 26 is selectively applied on a portion 30' of the build material 12, in the layer 14, as shown at reference number 106. The fusing agent 26 may be dispensed from any suitable applicator. As illustrated in FIG. 1 at reference number 106, the fusing agent 26 may be dispensed from an inkjet printhead 28, such as a thermal inkjet printhead or a piezoelectric inkjet printhead. The printhead 28 may be a drop-on-demand printhead or a continuous drop printhead. The inkjet printhead(s) 28 selectively applies the fusing agent 26 on those portions 30' of the layer 14 that are to be fused to become one layer of the 3D part precursor 38'. In the example shown at reference numeral 106 in FIG. 1, the fusing agent 26 is deposited in a square pattern (from a top view), on the area or portion 30' of the layer 14 and not on the areas or portions 32.

The printhead 28 may be selected to deliver drops of the fusing agent 26 at a resolution ranging from about 300 dots per inch (DPI) to about 1200 DPI. In other examples, the printhead 28 may be selected to be able to deliver drops of the fusing agent 26 at a higher or lower resolution. The drop velocity may range from about 5 m/s to about 24 m/s and the firing frequency may range from about 1 kHz to about 100 kHz. The printhead 28 may include an array of nozzles through which it is able to selectively eject drops of fluid. In one example, each drop may be in the order of about 10 pico liters (pl) per drop, although it is contemplated that a higher or lower drop size may be used. In some examples, printhead 28 is able to deliver variable size drops of the fusing agent 26.

The inkjet printhead(s) 28 may be attached to a moving XY stage or a translational carriage (neither of which is shown) that moves the inkjet printhead(s) 28 adjacent to the fabrication bed 22 in order to deposit the fusing agent 26 in desirable area(s) 30'. In other examples, the printhead(s) 28 may be fixed while a support member (similar to the fabrication bed 22) is configured to move relative thereto. The inkjet printhead(s) 28 may be programmed to receive commands from the central processing unit and to deposit the fusing agent 26 according to a pattern of a cross-section for the layer of the 3D part precursor 38' that is to be formed (i.e. the cross-section that is parallel to the contact surface 23).

In an example, the printhead(s) 28 may have a length that enables it to span the whole width of the fabrication bed 22 in a page-wide array configuration. As used herein, the term 'width' generally denotes the shortest dimension in the plane parallel to the X and Y axes of the contact surface 23, and the term 'length' denotes the longest dimension in this plane. However, it is to be understood that in other examples the term 'width' may be interchangeable with the term 'length'. In an example, the page-wide array configuration is achieved through a suitable arrangement of multiple printheads 28. In another example, the page-wide array configuration is achieved through a single printhead 28. In this other example, the single printhead 28 may include an array of nozzles having a length to enable them to span the width of the fabrication bed 22. This configuration may be desirable for single pass printing. In still other examples, the printhead(s) 28 may have a shorter length that does not enable them to span the whole width of the fabrication bed 22. In these other examples, the printhead(s) 28 may be movable bi-directionally across the width of the fabrication bed 22. This configuration enables selective delivery of the fusing agent 26 across the whole width and length of the fabrication bed 22 using multiple passes.

The fusing agent 26 may be a water-based dispersion including a radiation absorbing binding agent (i.e., an active material). The aqueous nature of the fusing agent 26 enables the fusing agent 26 to penetrate, at least partially, into the layer 14 of the build material 12. The build material 12 may be hydrophobic, and the presence of a co-solvent and/or a dispersant in the fusing agent 26 may assist in obtaining a particular wetting behavior. In some instances, the fusing agent 26 consists of water and active material. In other instances, the fusing agent 26 may further include a dispersing additive, a surfactant, a biocide, an anti-kogation agent, and combinations thereof.

The active material may be any suitable material that absorbs electromagnetic radiation. In an example, the active material is a near infrared light absorber. As one example, the active material may be an ink-type formulation including carbon black, such as, for example, the ink formulation commercially known as CM997A available from Hewlett-Packard Company. Within the ink-type formulation, the carbon black may be polymerically dispersed. The carbon black pigment may also be self-dispersed within the fusing agent 26 (e.g., by chemically modifying the surface of the carbon black). Still other examples of near infrared light absorbers include near infrared dyes, such as ADS830AT (2-[2-[2-chloro-3-[2-(1,3-dihydro-1,1,3-trimethyl-2H-benz[e]indol-2-ylidene)ethylidene]-1-cylohexen-1-yl]-ethenyl]-1,1,3-trimethyl-1H-benz[e]indolium 4-methylbenzenesulfonate, available from American Dye Source, Inc.), a naphthalocyanine with water-soluble substituents attached to each side chain thereof, or a phthalocyanine with water-soluble substituents attached to each side chain thereof. Examples of the water-soluble substituents include highly polar groups, such as phosphates, ethylene oxide, or sulfonates. Examples of inks including visible light enhancers are dye based colored ink and pigment based colored ink, such as the commercially available inks CE039A and CE042A, available from Hewlett-Packard Company. In another example, the active material is a metallic, infrared light absorber, such as silver (Ag), gold (Au), or platinum (Pt).

Examples of suitable carbon black pigments within the fusing agent 26 include those manufactured by Mitsubishi Chemical Corporation, Japan (such as, e.g., carbon black No. 2300, No. 900, MCF88, No, 33, No. 40, No. 45, No. 52, MA7, MA8, MA100, and No. 2200B); various carbon black pigments of the RAVEN® series manufactured by Columbian Chemicals Company, Marietta, Ga., (such as, e.g., RAVEN® 5750, RAVEN® 5250, RAVEN® 5000, RAVEN® 3500, RAVEN® 1255, and RAVEN® 700); various carbon black pigments of the REGAL® series, the MOGUL® series, or the MONARCH® series manufactured by Cabot Corporation, Boston, Mass., (such as, e.g., REGAL® 400R, REGAL® 330R, and REGAL® 660R); and various black pigments manufactured by Evonik Degussa Corporation, Parsippany, N.J., (such as, e.g., Color Black FW1, Color Black FW2, Color Black FW2V, Color Black FW18, Color Black FW200, Color Black S150, Color Black S160, Color Black S170, PRINTEX® 35, PRINTER® U, PRINTEX® V, PRINTEX® 140U, Special Black 5, Special Black 4A, and Special Black 4).

As mentioned above, the carbon black pigment may be polymerically dispersed within the fusing agent 26 by a polymeric dispersant having a weight average molecular weight ranging from about 12,000 to about 20,000. In this example, the fusing agent 26 includes the carbon black pigment (which is not surface treated), the polymeric dispersant, and water (with or without a co-solvent). When included, an example of the co-solvent may be 2-pyrollidinone. The polymeric dispersant may be any styrene acrylate or any polyurethane having its weight average molecular weight ranging from about 12,000 to about 20,000. Some commercially available examples of the styrene acrylate polymeric dispersant are JONCRYL® 671 and JONCRYL® 683 (both available from BASF Corp.). Within the fusing agent 26, a ratio of the carbon black pigment to the polymeric dispersant ranges from about 3.0 to about 4.0. In an example, the ratio of the carbon black pigment to the polymeric dispersant is about 3.6. It is believed that the polymeric dispersant contributes to the carbon black pigment exhibiting enhanced electromagnetic radiation absorption.

The amount of the carbon black pigment that is present in the fusing agent 26 ranges from about 3.0 wt. % to about 6.0 wt. % based on the total wt. % of the fusing agent 26. In other examples, the amount of the carbon black pigment present in fusing agent 26 ranges from greater than 4.0 wt. % up to about 6.0 wt. %. It is believed that these pigment loadings provide a balance between the fusing agent 26 having jetting reliability and electromagnetic radiation absorbance efficiency.

Surfactant(s) may be used to improve the wetting properties and the jettability of the fusing agent 26. Examples of suitable surfactants include a self-emulsifiable, nonionic wetting agent based on acetylenic diol chemistry (e.g., SURFYNOL® SEF from Air Products and Chemicals, Inc.), a nonionic fluorosurfactant (e.g., CAPSTONE® fluorosurfactants from DuPont, previously known as ZONYL FSO), and combinations thereof. In other examples, the surfactant is an ethoxylated low-foam wetting agent (e.g., SURFYNOL® 440 or SURFYNOL® CT-111 from Air Products and Chemical Inc.) or an ethoxylated wetting agent and molecular defoamer (e.g., SURFYNOL® 420 from Air Products and Chemical Inc.). Still other suitable surfactants include non-ionic wetting agents and molecular defoamers (e.g., SURFYNOL® 104E from Air Products and Chemical Inc.) or water-soluble, non-ionic surfactants (e.g., TERGITOL™ TMN-6 from The Dow Chemical Company). In some examples, it may be desirable to utilize a surfactant having a hydrophilic-lipophilic balance (HLB) less than 10.

Whether a single surfactant is used or a combination of surfactants is used, the total amount of surfactant(s) in the fusing agent 26 may range from about 0.5 wt. % to about 1.4 wt. % based on the total wt. % of the fusing agent 26.

Some examples of the co-solvent include 1-(2-hydroxyethyl)-2-pyrollidinone, 2-Pyrrolidinone, 1,5-Pentanediol, Triethylene glycol, Tetraethylene glycol, 2-methyl-1,3-propanediol, 1,6-Hexanediol, Tripropylene glycol methyl ether, N-methylpyrrolidone, Ethoxylated Glycerol-1 (LEG-1), and combinations thereof.

Examples of suitable biocides include an aqueous solution of 1,2-benzisothiazolin-3-one (e.g., PROXEL® GXL from Arch Chemicals, Inc.), quaternary ammonium compounds (e.g., BARDAC® 2250 and 2280, BARQUAT® 50-65B, and CARBOQUAT® 250-T, all from Lonza Ltd. Corp.), and an aqueous solution of methylisothiazolone (e.g., KORDEK® MLX from The Dow Chemical Co.). The biocide or antimicrobial may be added in any amount ranging from about 0.05 wt. % to about 0.5 wt. % with respect to the total wt. % of the fusing agent 26.

An anti-kogation agent may be included in the fusing agent 26. Kogation refers to the deposit of dried ink (e.g., fusing agent 26) on a heating element of a thermal inkjet printhead. Anti-kogation agent(s) is/are included to assist in preventing the buildup of kogation. Examples of suitable anti-kogation agents include oleth-3-phosphate (e.g., commercially available as CRODAFOS™ O3A or CRODAFOS™ N-3 acid from Croda), or a combination of oleth-3-phosphate and a low molecular weight (e.g., <5,000) polyacrylic acid polymer (e.g., commercially available as CARBOSPERSE™ K-7028 Polyacrylate from Lubrizol). Whether a single anti-kogation agent is used or a combination of anti-kogation agents is used, the total amount of anti-kogation agent(s) in the fusing agent 26 may range from greater than 0.20 wt. % to about 0.62 wt. % based on the total wt. % of the fusing agent 26. In an example, the oleth-3-phosphate is included in an amount ranging from about 0.20 wt. % to about 0.60 wt. %, and the low molecular weight polyacrylic acid polymer is included in an amount ranging from about 0.005 wt. % to about 0.015 wt. %.

It is to be understood that a single fusing agent 26 may be selectively applied to form the layer of the 3D part precursor 38', or multiple fusing agents may be selectively applied to form the layer of the 3D part precursor 38'.

After the fusing agent 26 is selectively applied in the desired portion(s) 30', the entire layer 14 of the build material 12 and the fusing agent 26 applied to at least a portion thereof are exposed to electromagnetic radiation 36. This is shown at reference numeral 108 of FIG. 1.

In an example, the electromagnetic radiation 36 may be infrared or near-infrared radiation. The electromagnetic radiation 36 is emitted from a radiation source 34, such as an IR or near-IR curing lamp, IR or near-IR light emitting diodes (LED), a microwave, or lasers with the desirable electromagnetic wavelengths. In other examples, the light source electromagnetic wavelengths range from about 100 nm (UV) to about 10 µm. In another example, the light source is a near-infrared light source with wavelengths of about 800 nm. In yet another example, the radiation source 34 is an infrared light source with wavelengths of about 2 µm. Any radiation source 34 may be used that emits electromagnetic radiation. The radiation source 34 may be attached, for example, to a carriage that also holds the inkjet printhead(s) 28. The carriage may move the radiation source 34 into a position that is adjacent to the fabrication bed 22. The radiation source 34 may be programmed to receive commands from the central processing unit and to expose the layer 14, including the fusing agent 26 and build material 12, to electromagnetic radiation 36.

The length of time the radiation 36 is applied for, or energy exposure time, may be dependent, for example, on one or more of: characteristics of the radiation source 34; characteristics of the build material 12; and/or characteristics of the fusing agent 26.

The fusing agent 26 enhances the absorption of the radiation 36, converts the absorbed radiation to thermal energy, and promotes the transfer of the thermal heat to the build material 12 in proximity thereof (i.e., build material 12 in contact with or close enough to the fusing agent 26 that it receives enough heat to fuse). In an example, the fusing agent 26 sufficiently elevates the temperature of the build material 12 above the melting point(s), allowing curing (e.g., sintering, binding, fusing, etc.) of the build material particles 12 to take place. In an example, the temperature is elevated about 50° C. above the melting temperature of the build material 12. The fusing agent 26 may also cause, for example, heating of the build material 12, below its melting point but to a temperature suitable to cause softening and bonding. It is to be understood that portions 32' of the build material 12 that do not have the fusing agent 26 applied thereto do not absorb enough energy to fuse. Exposure to radiation 36 forms the 3D layer or part precursor 38', as shown at reference numeral 108 in FIG. 1.

While the part precursor 38' is shown as a single layer, it is to be understood that the part precursor 38' may include several layers. Each additional layer of the part precursor 38' may be formed by repeating reference numerals 102, 106, and 108. For example, to form an additional layer of the part precursor 38', an additional layer of the build material 12 may be applied to the part precursor 38' shown in reference numeral 108 and the additional layer may have the fusing agent 26 selectively applied thereto and may be exposed to radiation 36 to form that additional layer. Any number of additional layers may be formed.

At reference numeral 110, the pre-treatment coating is applied. The pre-treatment coating includes a polycation layer and a polyanion layer applied in any order. In one example, the pre-treatment coating includes a first polycation layer 40A formed on the 3D printed part precursor 38, 38', a polyanion layer 42 formed on the first polycation layer 40A, and a second polycation layer 40B formed on the polyanion layer 42. In another example (not shown), the pre-treatment coating includes a polyanion layer formed on the 3D printed part precursor, and a polycation layer formed on the polyanion layer. In still another example (not shown), the pre-treatment coating includes a polycation layer formed on the 3D printed part precursor, and a polyanion layer formed on the polycation layer. In still other examples, the pre-treatment coating may include more than two or three layers of alternating polycation layers 40 and polyanion layers 42.

The pre-treatment coating may sit on an outermost layer/surface of the 3D printed part precursor 38, 38', or partially diffuse into and partially sit on top of the 3D printed part precursor 38, 38'. The positioning of the pre-treatment coating in and/or on the outermost layer/surface of the 3D printed part precursor 38, 38' provides a suitable surface for the subsequent application of ink. The surface provided by the pre-treatment coating promotes ink instability. It is believed that the pre-treatment coating "crashes" the colorant and/or conductive material out of the ink onto the substrate surface and substantially prevents distribution of the colorant and/or conductive material into the substrate, which enables a higher concentration of the colorant and/or conductive material in the applied area.

The polycation layer(s) 40A, 40B is/are formed by applying a polycation solution 40' to either the 3D printed part precursor 38, 38' or a previously applied and dried polyanion layer 42, and then drying the polycation solution 40'. The polycation solution 40' may be any polycation solution that includes a chloride ion. One example of the polycation solution 40' is an aqueous solution of 1% poly(allylamine) hydrochloride (PAH). This is an example of a polycation solution 40' containing a hydrochloride polymer with a primary amine functional group (i.e., a primary amine hydrochloride). In another example, the polycation solution 40' is a solution containing a hydrochloride polymer with a secondary amine functional group (i.e., a secondary amine hydrochloride). An examples of this polycation solution is an aqueous 1% poly(ethyleneimine)hydrochloride solution. The polymers may also be copolymers that are linear, branched, grafted, or other structured polymeric materials so long as either primary or secondary amine hydrochloride functional groups exist somewhere on the polymer.

The polyanion layer(s) 42 is/are formed by applying a polyanion solution 42' to either the 3D printed part precursor 38, 38' or a previously applied and dried polycation layer 40A or 40B, and then drying the polyanion solution 42'. The polyanion solution 42' may be any polyanion solution that includes a sodium ion. One example of the suitable polyanion solution 42' is an aqueous solution of 1% poly(sodium 4-styrenesulfonate) (PSS). In another example, the polyanion solution 42' is a solution containing an acidic polymer containing carboxylic acid (i.e., sodium carboxylates), sulfonic acid (i.e., sodium sulfonates), or phosphoric acid functional groups (i.e., sodium phosphonates). Some examples include poly(acrylic) acid, and polyvinyl phosphoric acid), sodium salt. The polymers may also be copolymers that are linear, branched, grafted, or other structured polymeric materials so long as acidic functional groups exist somewhere on the polymer.

The polymers used in polycation solution 40' and the polyanion solution 42' may also have any number average molecular weight greater than zero. If thermal inkjet printing is used to apply the polycation solution 40' or the polyanion solution 42', a lower number average molecular weight will avow for better jettability. If piezo electric inkjet printing is used to apply the polyanion solution 40' or the polyanion solution 42', a higher number average molecular weight will allow for better jettability. The range of suitable number average molecular weights of the polymers used in the polycation solution 40' and the polyanion solution 42' for good jettability will be depend, in part, on the solvent used and the structure of the polymer. In one example, the number average molecular weight of the polymer used in the polycation solution 40' is 70,000. In another example, the number average molecular weight of the polymer used in the polyanion solution 42' is 500,000. The polymers added may affect the viscosity of the ink, which can be tailored for the particular printing technique that is used.

The polycation solution 40' and the polyanion solution 42' may be applied by any suitable selective or non-selective process. As illustrated in FIG. 1 at reference numeral 110, the polycation solution 40' and the polyanion solution 42' may be applied by respective printheads 28', 28''. The printheads 28' and 28'' may be any of the printheads described above in relation to the printhead(s) 28 (which is used to apply the fusing agent 26 at reference numeral 106 in FIG. 1). The printheads 28' and 28'' may also function (e.g., move, receive commands from the central processing unit, etc.) and have the same dimensions (e.g., length and width) as the printhead(s) 28 described above. The printhead(s) 28' selectively apply the polycation solution 40' on either the 3D printed part precursor 38, 38' or a previously applied and dried polyanion layer 42, and the printhead(s) 28'' selectively apply the polyanion solution 42' on either the 3D printed part precursor 38, 38' or a previously applied and dried polycation layer 40A, 40B. The printheads 28', 28'' may deposit the respective solutions 40', 42' in a single pass when the deposited solution dries before the application of a subsequent solution.

While not shown in FIG. 1, the polycation solution 40' and the polyanion solution 42' may be applied by spray coating. In one example, the polycation solution 40' may be prepared with a high vapor pressure solvent (e.g., isopropyl alcohol, ethanol, acetone, etc.) as the main carrier. The polycation solution 40' may then be passed through a jet nebulizer (i.e., atomizer) at high pressure to create a high velocity mist (or aerosol) consisting of the various solution components, in addition to the cations. The mist may be selectively deposited on either the 3D printed part precursor 38, 38' or a previously applied and dried polyanion layer 42. In another example, the polyanion solution 42' may be prepared with a high vapor pressure solvent (e.g., isopropyl alcohol, ethanol, acetone, etc.) as the main carrier. The polyanion solution 42' may then be passed through a jet nebulizer (i.e., atomizer) at high pressure to create a high velocity mist (or aerosol) consisting of the various solution components, in addition to the anions. The mist may be selectively deposited on either the 3D printed part precursor 38, 38' or a previously applied and dried polycation layer 42.

The jet nebulizer may be attached to a moving XY stage or a translational carriage (none of which is shown) that moves the jet nebulizer adjacent to the fabrication bed 22 in order to deposit the polycation solution 40' onto the part precursor 38, 38' or a previously applied and dried polyanion layer 42, or the polyanion solution 42' onto the part precursor 38, 38' or a previously applied and dried polycation layer 40A, 40B. In other examples, the jet nebulizer may be fixed while a support member (similar to the fabrication bed 22) is configured to move relative thereto. The jet nebulizer may be programmed to receive commands from the central processing unit.

The polycation solution 40' and the polyanion solution 42' may also be applied by piezo electric inkjet printing, dip coating, painting, or any other suitable selective or non-selective coating process. Dip coating may be used, for example, when it is desirable to coat all of the exposed surfaces of the part precursor 38, 38' or previously applied layer 40A, 42, 40B. In another example, the surface of the part precursor 38, 38' may be plasma treated to create a negative or positive surface charge before the part precursor 38, 38' is dip coated in the polycation solution 40' or the polyanion solution (respectively).

To form each of the respective layers 40A, 42, 40B, the respective solution 40' or 42' is applied and then dried. It is to be understood that each layer 40A, 42, 40B is dried prior to the application of the other solution 40' or 42'. Drying may be accomplished by any suitable drying method. In one example, drying is accomplished by passive drying. As an example of passive drying, the fabrication bed 22 may be sufficiently hot that the polycation solution 40' and the polyanion solution 42' dry quickly (e.g., less than 5 minutes, less than 1 minute, less than 10 seconds, etc.) after application without any additional heat exposure. In another example, drying is accomplished by active drying. As an example of active drying, drying is accomplished by exposing the applied polycation and/or poly anion solutions 40', 42' to additional heat. In an example, the elevated temperature used for additional heating ranges from about 50° C. to about 185° C. In another example, the elevated temperature may range from about 50° C. to about 5° C. below the melting point of the build material 12. In still another example, the elevated temperature may range from about 50° C. to about 5° C. below the decomposition temperature of the polycation and polyanion layers 40A, 42, 40B. In any of the examples, the temperature of the heat that may be used to dry the polycation solution 40' and the polyanion solution 42' may depend on the build material 12 that is used to form the 3D part precursor 38, 38'. The temperature to which the polycation solution 40' and the polyanion solution 42' are exposed should be sufficiently lower than the melting point of the build material 12 used so that build material 12 does not fuse or sinter in undesired places 32, 32' or so that already fused or sintered build material (e.g., part precursor 38, 38') does not warp.

In some instances, the pre-treatment coating may be applied over all of the 3D printed part precursor 38, 38'. For example, the pre-treatment coating may be applied on a single layered 3D part precursor (e.g., 38, 38'), or on the outermost layer of a multi-layered 3D part precursor (not shown). In another example, the pre-treatment coating may be applied on one or more interior layers of a multilayered part precursor. For example, if it is desirable to form an embedded electronic component, the pre-treatment coating may be applied over some or all of the 3D printed part precursor 38, 38', and then ink 44 (described below) may be applied to the pre-treatment coating, and then subsequent layer(s) may be formed over the ink 44. The subsequent layer(s) may be formed by repeating reference numerals 102 and 104 or reference numerals 102, 106, and 108 to form another sintered or fused layer on the ink 44 and pre-treatment coating. It is to be understood that the pre-treatment coating may be applied to any of the layers of a multilayered part precursor.

In other instances, the pre-treatment coating may be applied to some (but not all) of the part precursor 38, 38'. Application of the pre-treatment coating on some, but not all, of the part precursor 38, 38' may be used, for example, when the ink is to be applied to a portion of the part precursor 38, 38' that is to be visible when the final part is complete. For example, if subsequent layers are to be formed on the part precursor 38, 38', but a portion of the part precursor 38, 38' will be visible in the final part (i.e., not covered by a subsequent layer), then the pre-treatment coating may be applied on the part precursor 38, 38' at area(s) that will be visible in the final 3D part and not applied on the part precursor 38, 38' at area(s) that will be covered by a subsequently formed layer. Still further, application of the pre-treatment coating on some, but not all, of the part precursor 38, 38' may also be used, for example, when an outer surface of the layer or part precursor 38, 38' being fabricated is to be black and nonconductive. In these instances, the pre-treatment coating may be applied to area(s) that are to be colored and/or conductive (through a subsequently deposited ink), and not applied to area(s) that are to remain black and nonconductive. Still further, application of the pre-treatment coating on some, but not all, of the part precursor 38, 38' may also be used, for example, when an electronic component is to be embedded in the multilayer part precursor. The pre-treatment coating may be applied on an internal layer of a multilayer part precursor at which the electronic component is to be embedded.

After the pre-treatment coating has been formed on the part precursor 38, 38', an ink 44 is applied on the pre-treatment coating (e.g., on the outermost layer of the pre-treatment coating). The ink 44 may cover the entire pre-treatment coating or a portion thereof. As illustrated in FIG. 1 at reference numeral 112, the ink 44 may be applied by one or more printhead(s) 28'''. The printhead(s) may be any of the printheads described above in relation to the printhead(s) 28 (which is used to apply the fusing agent 26 at reference numeral 106 in FIG. 1). The printhead(s) may also function (e.g., move, receive commands from the central processing unit, etc.) and have the same dimensions (e.g., length and width) as the printhead(s) 28 described above. The printhead(s) 28''' may selectively apply the ink 44 on the pre-treatment coating. In one example, the ink 44 may applied directly after the last layer of the pre-treatment coating. The last layer of the pre-treatment coating and the ink 44 may be applied by different printheads 28' or 28" and 28''', but in the same pass over the 3D part precursor 38, 38'. When deposited in a single pass, it is to be understood that the deposited solution dries before the application of the ink 44.

In some examples, the ink 44 is a colored ink. The colored ink includes a colorant and water. In some instances, the colored ink includes these components and no other components. In other instances, the colored ink may further include a dispersing additive, a co-solvent, an anti-kogation agent, a biocide, an acrylic latex binder, and combinations thereof.

The colored ink includes a colorant (e.g., pigment and/or dye). The colorant may have any color (e.g., cyan, magenta, yellow, white, etc.), Some examples of the colored ink include a set of cyan, magenta, and yellow inks, such as C1893A (cyan), C1984A (magenta), and C1985A (yellow); or C4801A (cyan), C4802A (magenta), and C4803A (yellow); all of which are available from Hewlett-Packard Company. Other commercially available colored inks include C9384A (printhead HP 72), C9383A (printhead HP 72), C4901A (printhead HP 940), and C4900A (printhead HP 940). Some examples of a white colorant include pigments, such as titanium dioxide ($TiO_2$), zinc oxide (ZnO), calcium carbonate ($CaCO_3$), barium sulfate ($BaSO_4$), or combinations thereof. Some commercially available examples of white colorant are available from DuPont under the tradename TI-PURE®, an example of which includes TI-PURE® R-706.

The colorant in the colored ink may, in some instances, be dispersed with a dispersing additive. As such, the dispersing additive helps to uniformly distribute the colorant throughout the colored ink. The dispersing additive may be present in the colored ink in an amount ranging from about 0.01 wt. % to about 0.8 wt. % based on the total wt. % of the colorant. Some examples of the dispersing additive include a water soluble acrylic acid polymer (e.g., CARBOSPERSE® K7028 available from Lubrizol), a high molecular weight block copolymer with pigment affinic groups (e.g., DISPERBYK®-190 available BYK Additives and Instruments), and combinations thereof.

The colored ink may also include a co-solvent. The co-solvent may be present in an amount ranging from about 10 wt. % to about 30 wt. % based on the total wt. % of the colored ink. Some examples of suitable co-solvents include 2-pyrrolidinone, 2-methyl-1,3-propanediol, tetraethylene glycol, tripropylene glycol methyl ether, dipropylene glycol methyl ether, tripropylene glycol butyl ether, dipropylene glycol butyl ether, triethylene glycol butyl ether, 1,2-hexanediol, 1-(2-hydroxyethyl)-2-pyrrolidinone, 1,6-hexanediol, and combinations thereof.

The colored ink may additionally include an anti-kogation agent, a biocide, an acrylic latex binder, and combinations thereof. Examples of anti-kogation agents include oleth-3-phosphate or polyoxyethylene (3) oleyl mono/di-phosphate (e.g., CRODAFOS® N-3A from Croda, now CRODAFOS® O3A), a metal chelator/chelating agent, such as methylglycinediacetic acid (e.g., TRILON® M from BASF Corp.), and combinations thereof, Examples of suitable biocides include an aqueous solution of 1,2-benzisothiazolin-3-one (e.g., PROXEL® GXL from Arch Chemicals, Inc.), quaternary ammonium compounds (e.g., BARDAC® 2250 and 2280, BARQUAT® 50-65B, and CARBOQUAT® 250-T, all from Lonza Ltd, Corp,), an aqueous solution of methylisothiazolone (e.g., KORDEK® MLX from The Dow Chemical Co.), and combinations thereof. Examples of the acrylic latex binder include a copolymer of any two or more of styrene, acrylic acid, methacrylic acid, methyl methacrylate, ethyl methacrylate, and butyl methacrylate.

The colored ink may also include a binder or other additives, such as a humectant and lubricant (e.g., LIPONIC® EG-1 (LEG-1) from Lipo Chemicals), a chelating agent (e.g., disodium ethylenediaminetetraacetic acid (EDTA-Na)), and/or a buffer.

An example of the pigment based colored ink may include from about 1 wt. % to about 10 wt. % of pigment(s), from about 10 wt. % to about 30 wt. % of co-solvent(s), from about 0.5 wt. % to about 2 wt. % of dispersant(s), from 0.01 wt. % to about 1 wt. % of anti-kogation agent(s), from about 0.1 wt. % to about 5 wt. % of binder(s), from about 0.05 wt. % to about 0.1 wt. % biocide(s), and a balance of water. An example of the dye based colored ink may include from about 1 wt. % to about 7 wt. % of dye(s), from about 10 wt % to about 30 wt. % of co-solvent(s), from about 0.25 wt. % to about 2 wt. % of dispersant(s), from 0.05 wt. % to about 0.1 wt. % of chelating agent(s), from about 0.005 wt. % to about 0.2 wt. % of buffer(s), from about 0.05 wt. % to about 0.1 wt. % biocide(s), and a balance of water.

In some examples, the ink 44 is a conductive ink. The conductive ink includes a conductive material and water. The conductive material in the conductive ink forms a conductive element on the 3D printed part precursor 38, 38' that conducts electricity once the conductive ink has been applied to the pre-treatment coating and dried or cured. In some examples, the conductive material may also act as a colorant in the conductive ink.

The conductive material may be any material that is capable of conducting electric current. In one example, the conductive material is silver (Ag), copper (Cu), or zinc (Zn). Other examples of suitable conductive materials include metal alloys (where the metals are selected from, for example, Ag, Au, Cu, Fe, Sn, Ti, Mn Ni, Rh, Ru, Mo, Ta, Ti, Pt, or Pd), metal oxide (e.g., iron oxide), metal coated oxide (e.g., iron oxide coated with Ag, Au or Pt), cadmium selenide, and metal coated silica (e.g., silica coated with Ag or Au). Still other examples of suitable conductive materials include carbon black or other carbon analogs (e.g., carbon nanotubes, graphene, etc.). It is to be understood that any combinations of the previously listed conductive materials may also be used.

In addition to the conductive material, the conductive ink may include similar components as the colored ink (e.g., colorant(s), co-solvent(s), dispersant(s), anti-kogation agent(s), biocide(s), water, etc.).

After the conductive ink is applied to the pre-treatment coating, the conductive ink may be cured. As used in reference to the conductive ink, "curing" refers any process that will enable the dried conductive ink (i.e., the ink in a dried state) to be electrically conductive. Some inks cure by drying. In an example, the conductive ink may cure at room temperature (i.e., 18° C. to 22° C.). In another example, the conductive ink may cure by the heat from the fabrication bed 22. Other inks cure by drying and self-sintering (which occurs during the drying). Still other inks cure with the addition of high heat or strong irradiation. With these inks, any suitable radiation or thermal process may be used. In one example, any suitable source of radiation may be used to initiate curing, such as, for example, UV lamps, LED (light emitting diode) lamps, LEP (light emitting plasma) plasma torches, or lasers operating in the UV range. Electron beam curing may also be used. The actual wavelength (within the UV range of 280 nm to 400 nm) and intensity of the ultraviolet radiation used may vary, depending at least in part, upon the components included in the conductive ink. In still another example, the conductive ink is cured by exposing the 3D part precursor 38, 38' with the pre-treatment coating and conductive ink thereon to heat (e.g., an elevated temperature ranging from about 50° C. to about 400° C.). The amount of heat that may be used to cure the conductive ink may depend on the build material 12 that is used to form the 3D part precursor 38, 38'. The temperature to which the 3D part precursor 38, 38' with the pre-treatment coating and conductive ink thereon is exposed should be lower (e.g., 5°

C. to about 50° C. lower) than the melting point of the build material 12 used so that build material 12 does not fuse or sinter in undesired places 32, 32' or so that already fused or sintered build material (e.g., part precursor 38, 38') does not warp.

In some instances, the ink 44 may be applied over all of the applied pre-treatment coating. Application of the ink 44 over all of the pre-treatment coating may be used for example, to color the entire exterior surface and/or to form an electronic component that covers the entire exterior surface.

In other instances, the ink 44 may be applied to some (but not all) of the pre-treatment coating. Application of the ink 44 on some, but not all, of the pre-treatment coating may be used, for example, when an outer surface of the layer or part being fabricated is to be black and nonconductive. In these instances, the ink 44 may be applied to area(s) that are to be colored and/or conductive, and not applied to area(s) that are to remain black and nonconductive.

In instances where the method 100 results in the formation of the final 3D part, the part may be removed from the fabrication bed 22, and any uncured build material 12 may be removed from the part.

Another example of the method 100 shown in FIG. 1 begins with a preformed part precursor 38, 38'. In these examples, the method 100 begins with the formation of the pre-treatment coating (as described in reference to reference numeral 110) and the subsequent application of the ink 44 (as described in reference to reference numeral 112). It is to be understood that the fabrication bed may not be utilized in this example.

Figure 2:
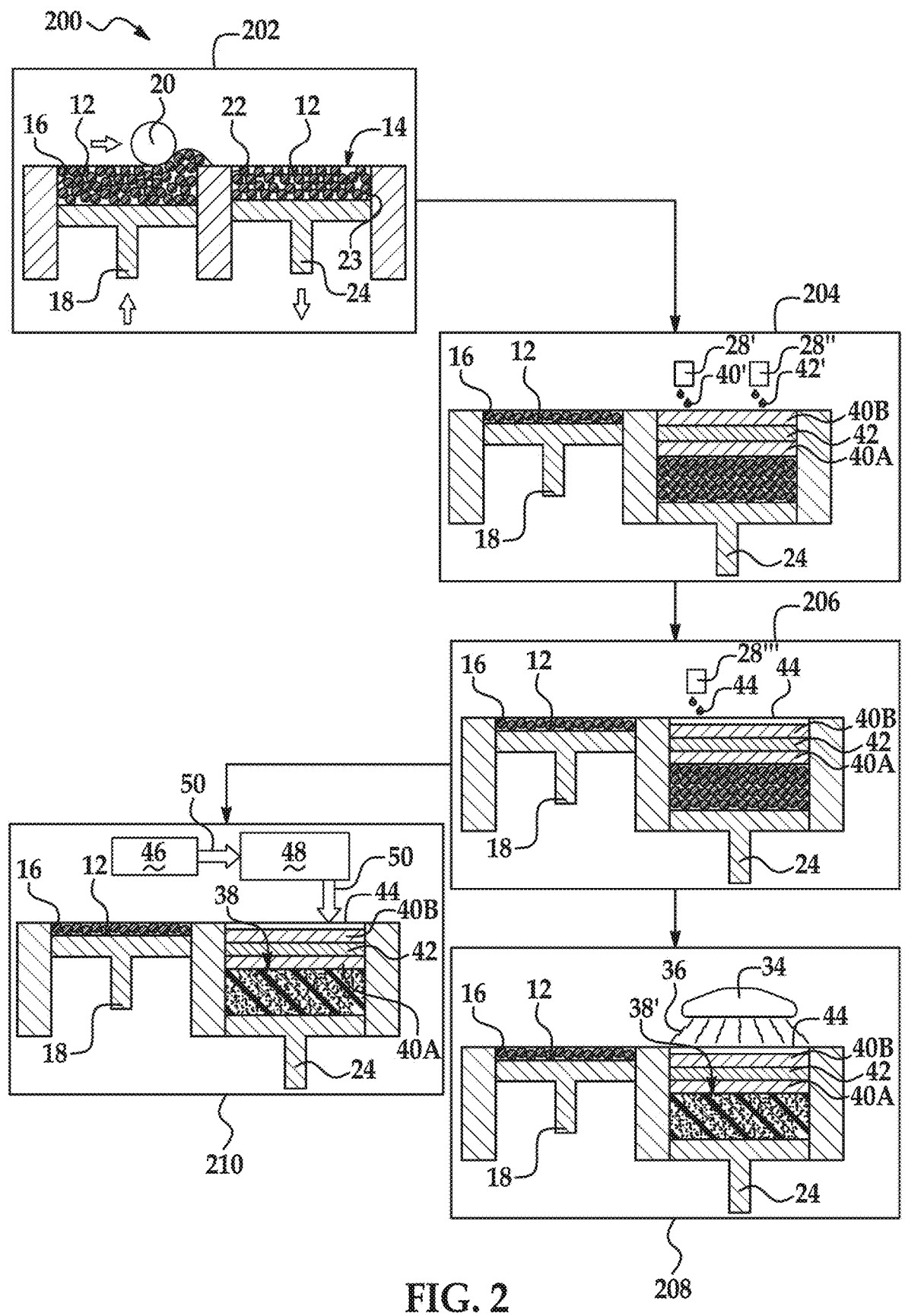
FIG. 2 is a flow diagram illustrating another example of a 3D printing method disclosed herein.

FIG. 2 shows another example of the 3D printing method. As an example, the method 200 may be used to apply color to the top of a layer or part precursor 38, 38' that is being formed. As another example, the method 200 may be used to form a conductive element on the top of a layer or part precursor 38, 38' that is being formed.

As shown at reference numeral 202, the method 200 includes applying a build material 12. One layer 14 of the build material 12 has been applied. The build material 12 and the layer 14 may include any material and may have any of the characteristics described above in reference to the build material 12 and the layer 14 (respectively) in the method 100.

In the example shown at reference numeral 202, applying the build material 12 includes the use of a supply bed 16 (including a supply of the build material 12), the delivery piston 18, the roller 20, the fabrication bed 22 (having a contact surface 23), and the fabrication piston 24. Each of these physical elements may function as and have the characteristics of the corresponding element described above in reference to the method 100.

After the build material 12 is applied at reference numeral 202, the pre-treatment coating is applied at reference numeral 204. In one example, the pre-treatment coating includes a first polycation layer 40A formed on the build material 12, a polyanion layer 42 formed on the first polycation layer 40A, and a second polycation layer 40B formed on the polyanion layer 42. In another example (not shown), the pre-treatment coating includes a polyanion layer formed on the build material 12, and a polycation layer formed on the polyanion layer. In still another example (not shown), the pre-treatment coating includes a polycation layer formed on the build material 12, and a polyanion layer formed on the polycation layer. In still other examples, the pre-treatment coating may include more than two or three layers of alternating polycation layers 40A, 40B and polyanion layers 42. The pre-treatment coating may sit on an outermost layer/surface of the build material 12, or partially diffuse into and partially sit on top of the build material 12.

The polycation layer(s) 40A, 40B is/are formed by applying a polycation solution 40' to the build material 12 or a previously applied and dried polyanion layer 42 and then drying the polycation solution 40'. The polycation solution 40' may be any polycation solution described above in reference to the polycation solution 40' in the method 100.

The polyanion layer(s) 42 is/are formed by applying a polyanion solution 42' to the build material 12 or a previously applied and dried polycation layer 40, and then drying the polyanion solution 42'. The polyanion solution 42' may be any polyanion solution described above in reference to the polyanion solution 42' in the method 100.

The polycation solution 40' and the polyanion solution 42' may be applied by any process described above in reference to the method 100. As illustrated in FIG. 2 at reference numeral 204, the polycation solution 40' and the polyanion solution 42' may be applied by respective printheads 28', 28". The printheads 28' and 28" may be any of the printheads describe above in reference to the printhead(s) 28 (which is used to apply the fusing agent 26 at reference numeral 106 in FIG. 1). The printheads 28' and 28" may also function (e.g., move, receive commands from the central processing unit, etc.) and have the same dimensions (e.g., length and width) as the printhead(s) 28 described above. The printhead(s) 28' selectively apply the polycation solution 40' on the build material 12 or a previously applied and dried polyanion layer 42, and the printhead(s) 28" selectively apply the polyanion solution 42' on the build material 12 or a previously applied and dried polycation layer 40.

While not shown in FIG. 2, the polycation solution 40' and the polyanion solution 42' may be applied by spray coating. The spray coating of the polycation solution 40' and the polyanion solution 42' may be accomplished by any means described in reference to the method 100. Once they have been applied, the respective polycation solution 40' and the polyanion solution 42' are dried to form the polycation layer 40 and the polyanion layer 42. Drying may be accomplished by any means described in reference to the method 100.

In some instances, the pre-treatment coating may be applied over all of the build material 12, or may be applied to some (but not all) of the build material 12.

After the pre-treatment coating has been formed on the build material 12, an ink 44 is applied on the pre-treatment coating. The ink 44 may cover the entire pre-treatment coating or only a portion thereof. As illustrated in FIG. 2 at reference numeral 206, the ink 44 may be applied by one or more printhead(s) 28'''. The printhead(s) 28''' may be any of the printheads described above in relation to the printhead(s) 28 (which is used to apply the fusing agent 26 at reference numeral 106 in FIG. 1). The printhead(s) 28''' may also function (e.g., move, receive commands from the central processing unit, etc.) and have the same dimensions (e.g., length and width) as the printhead(s) 28 described above. Additionally, the printhead(s) 28''' may deliver (e.g., resolution, drop velocity, firing frequency, etc.) the ink 44 as described above in relation to printhead(s) 28''' in the method 100. The printhead(s) 28''' may selectively apply the ink 44 on the pre-treatment coating.

In some examples, the ink 44 is a colored ink. The colored ink may be any of the colored inks, may include any material (e.g., colorant, dispersing additive, co-solvent, anti-kogation agent, biocide, and acrylic latex binder), and may have any of the characteristics described above in reference to the colored ink in the method 100.

In some examples, the ink 44 is a conductive ink. The conductive ink may be any of the conductive inks, may include any material (e.g., conductive material, colorant, dispersant, co-solvent, anti-kogation agent, and biocide), and may have any of the characteristics described above in reference to the conductive ink in the method 100. After the conductive ink is applied to the pre-treatment coating, the conductive ink may be cured. Curing may be accomplished by any means described above in reference to the method 100. Additionally, the electromagnetic radiation 36 applied at reference numeral 208 or the laser beam 50 applied at reference numeral 210 may be used to cure the conductive ink. In this example, it is to be understood that fusing or sintering of the build material 12 and curing of the conductive ink occur simultaneously.

In some instances, the ink 44 may be applied over all of the applied pre-treatment coating, or the ink 44 may be applied to some (but not all) of the pre-treatment coating.

Two variations of the method 200 may take place after the pre-treatment coating and the ink 44 are applied to the build material 12. In one example, the method involves exposing the build material 12, the pre-treatment coating, and the ink 44 to radiation 36 (e.g., reference numeral 208). In another example, the method 200 may involve selectively applying a laser beam 50 to a portion 30 of the build material 12 having the pre-treatment coating and the ink 44 thereon (e.g., reference numeral 210). Each of these examples of the method 200 will be described in more detail below.

In an example, after the pre-treatment coating and the ink 44 are applied to the build material 12, the entire layer 14 of the build material 12, the pre-treatment coating, and the ink 44 applied to at least a portion thereof is exposed to electromagnetic radiation 36. This is shown at reference numeral 208. In this example, the ink 44 may act as a fusing agent. The ink 44 may include any material (e.g., active material, dispersing additive, surfactant, biocide, and anti-kogation agent), and may have any of the characteristics described above in reference to the fusing agent 26 in the method 100. The ink 44, acting as fusing agent 26, enhances the absorption of the radiation 36, converts the absorbed radiation to thermal energy, and promotes the transfer of the thermal heat to the build material 12 in proximity thereto. In this example, the pre-treatment coating enables the heat from the ink 44 to diffuse through to the build material 12 in contact therewith. This enables the build material 12 to receive enough heat to fuse.

While not shown in FIG. 2, some examples of the method 200 may include applying a separate fusing agent (i.e., distinct from the ink 44) prior to exposing the entire layer 14 of the build material 12, the pre-treatment coating, and the ink 44 applied to at least a portion thereof to electromagnetic radiation 36. Application of a separate fusing agent (e.g., fusing agent 26) may be used, for example, when the ink 44 does not act as a fusing agent. In these instances, the separate fusing agent (not shown) may be applied on all of the portion of the build material 12 that is to be fused (with or without pre-treatment coating and/or ink 44 applied thereon). In an example, the separate fusing agent is applied on the pre-treatment coating, prior to the ink 44 being applied thereon. Further, application of a separate fusing agent may be used, for example, when the ink 44 does act as a fusing agent but is to be applied on all some (but not all) of the pre-treatment coating, or the pre-treatment coating is to be applied on some (but not all) of the build material 12 that is to be fused. In these instances, the separate fusing agent (not shown) may be applied on the pre-treatment coating that does not have ink 44 applied thereon and/or may be applied on the build material 12 that is to be fused and that does not have pre-treatment coating applied thereon.

In another example of the method 200, after the pre-treatment coating and the ink 44 are applied to the build material 12, a laser beam 50 is selectively applied on a portion 30 of the build material 12, the pre-treatment coating, and the ink 44 applied to at least a portion thereof. This is shown at reference numeral 210. The laser beam 50 may be applied using any equipment and in any manner described above in reference to the method 100.

The build material 12 absorbs the radiation from the laser beam 50 and converts the radiation to thermal energy. In an example, the laser beam 50 transfers enough energy to the build material 12 to elevate the temperature of the build material 12 above the melting point(s), allowing curing (e.g., sintering, binding, fusing, etc.) of the build material particles 12 to take place. The laser beam 50 may interact with the build material 12 in any way described above in reference to the method 100.

While not shown in FIG. 2, the layer 14 of the build material 12 may be exposed to heating prior to the exposure to electromagnetic radiation 36 at reference numeral 208, prior to the selective application of the laser beam 50 at reference numeral 210, or prior to application of the pre-treatment coating at reference numeral 204. Heating is performed to pre-heat the build material 12, and may be applied in any manner and with any heat source described above in reference to the method 100.

In instances where the method 200 results in the formation of the final 3D part, the part may be removed from the fabrication bed 22, and any uncured build material 12 may be removed from the part.

Either method 100 or 200 can be used to form the 3D printed part. Examples of the 3D printed part are depicted in FIG. 1 at reference numeral 112 and in FIG. 2 at reference numerals 208 and 210. The 3D printed part includes a sintered or fused substrate (38, 38'), a pre-treatment coating (formed of layers 40A, 42, 40B) on the sintered or fused substrate, and an ink 44 applied at least to a portion of the pre-treatment coating.

In one example, the 3D printed part has a pre-treatment coating that includes the first polycation layer 40A formed on the sintered or fused substrate, the polyanion layer 42 formed on the first polycation layer 40A, and the second polycation layer 40B formed on the polyanion layer 42. In another example (not shown), the 3D printed part has a pre-treatment coating that includes a polyanion layer formed on the sintered or fused substrate, and a polycation layer formed on the polyanion layer. In still another example (not shown), the 3D printed part has a pre-treatment coating that includes a polycation layer formed on the sintered or fused substrate, and a polyanion layer formed on the polycation layer. In still other examples, the 3D printed part has a pre-treatment coating that includes more than two or three layers of alternating polycation layers 40A, 40B, and polyanion layers 42.

Each polycation layer 40A, 40B may be formed of any polycation that includes a chloride ion. As examples, the polycation layers 40 are formed of poly(allylamine)hydrochloride (e.g., number average molecular weight of 70,000) or poly(ethyleneimine)hydrochloride. The polymers may also be copolymers that are linear, branched, grafted, or other structured polymeric materials so long as either primary or secondary amine hydrochloride functional groups exist somewhere on the polymer. The polycation layers 40A, 40B may contain one polycation or multiple polycations, and the polycation layers 40A, 40B may contain the same polycation(s) as each other or different polycation(s) than each other.

Each polyanion layer 42 may be formed of any polyanion that includes a sodium ion. As examples, the polyanion layers 42 are formed of an acidic polymer containing carboxylic acid, sulfonic acid, or phosphoric acid functional groups. Some examples include poly(acrylic) acid, poly(sodium 4-styrenesulfonate), and polyvinyl phosphoric acid), sodium salt. The polymers may also be copolymers that are linear, branched, grafted, or other structured polymeric materials so long as acidic functional groups exist somewhere on the polymer. The polyanion layers 42 may contain one polyanion or multiple polyanions, and the polyanion layers 42 may contain the same polyanion(s) as each other or different polyanion(s) than each other.

The pre-treatment coating may be on all or a portion (but not all) of the sintered or fused substrate.

The ink 44 may be on all or a portion (but not all) of the pre-treatment coating.

In one example of the 3D printed part, the ink 44 is any of the colored inks and/or conductive inks disclosed herein.

To further illustrate the present disclosure, examples are given herein. It is to be understood that these examples are provided for illustrative purposes and are not to be construed as limiting the scope of the present disclosure.

EXAMPLES

Three examples of the 3D printed part, including the pre-treatment coating, and five comparative 3D printed parts were prepared. The example 3D printed parts are referred to herein as example 3D printed part 1, example 3D printed part 2, and example 3D printed part 3. The comparative 3D printed parts are referred to herein as comparative 3D printed part 1, comparative 3D printed part 2, comparative 3D printed part 3, comparative 3D printed part 4, and comparative 3D printed part 5. The pre-treatment coating used in the example 3D printed parts was formed using an aqueous solution of 1% poly(allylamine)hydrochloride (number average molecular weight of 70,000) to form the polycation layers and an aqueous solution of 1% poly(sodium 4-styrenesulfonate) (number average molecular weight of 500,000) to form the polyanion layers. The example and comparative 3D printed parts were prepared with either a commercially available, Nylon PA12, selective laser sintered substrate (manufactured by Stratasys) or a multi jet fused substrate formed from a commercially available, Nylon PA12 powder (manufactured by Evonik) with a fusing agent. The example and comparative 3D printed parts were also prepared with a commercially available silver ink, namely NBSIJ-MU01 (manufactured by Mitsubishi), a cyan ink (manufactured by Hewlett-Packard Company), a magenta ink (manufactured by Hewlett-Packard Company), and/or a yellow ink (manufactured by Hewlett-Packard Company). The cyan, magenta, and yellow inks are in the HP 971 (CYM) series.

Figure 3A:
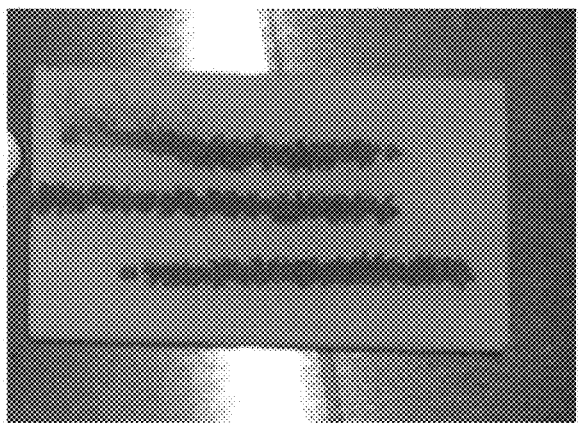
FIG. 3A is an image of a comparative 3D printed part.
Figure 3B:
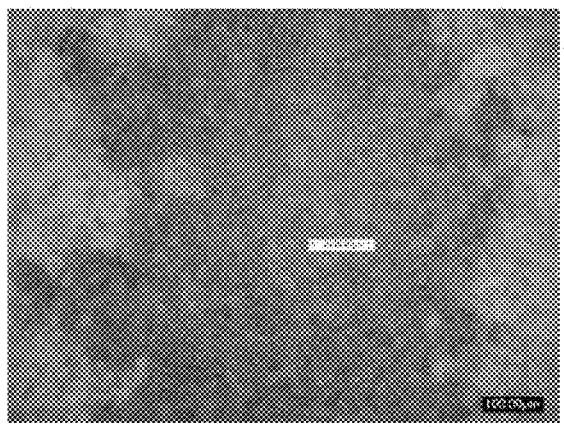
FIG. 3B is a microscopic image of a portion of the comparative 3D printed part shown in FIG. 3A.

Comparative 3D printed part 1 was prepared by printing the silver ink directly onto the selective laser sintered substrate. No pre-treatment coating was present on the selective laser sintered substrate. The printed silver ink on comparative 3D printed part 1 had a line width of about 2148 µm, and a multimeter reading of the printed silver ink on comparative 3D printed part 1 indicated an open circuit. These measurements indicate that comparative 3D printed part 1 has poor print quality (too much bleed) and is not conductive. FIG. 3A shows an image of comparative 3D printed part 1, and FIG. 3B shows a magnified image, using a scalar bar of 100.00 µm, of a portion of comparative 3D printed part 1. The line width of the printed silver ink on comparative 3D printed part 1 is indicated on FIG. 3B.

Figure 4A:
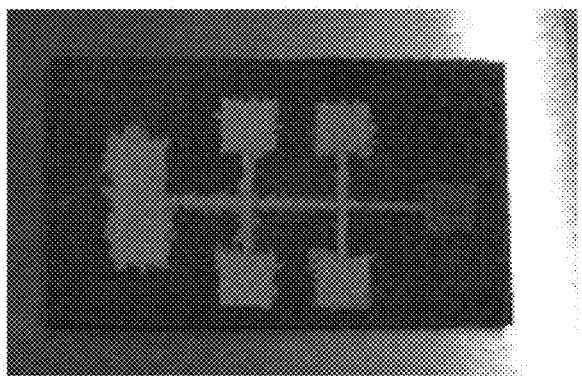
FIG. 4A is an image of another comparative 3D printed part.
Figure 4B:
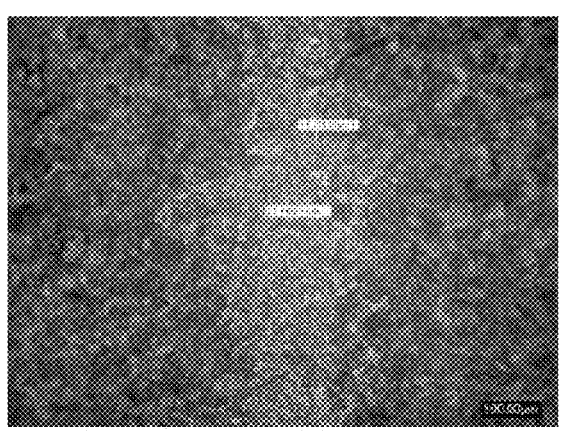
FIG. 4B is a microscopic image of a portion of the comparative 3D printed part shown in FIG. 4A.

Comparative 3D printed part 2 was prepared by printing the silver ink directly onto the multi jet fused substrate. No pre-treatment coating was present on the multi jet fused substrate. The printed silver ink on comparative 3D printed part 2 had a line width of about 711 µm at one point of the line and a line width of 1422 µm at another point of the line. A multimeter reading of the printed silver ink on comparative 3D printed part 2 indicated an open circuit. These measurements indicate that comparative 3D printed part 2 has poor print quality (too much bleed) and is not conductive. FIG. 4A shows an image of comparative 3D printed part 2, and FIG. 4B shows a magnified image, using a scalar bar of 100.00 µm, of a portion of comparative 3D printed part 2. The line widths of the printed silver ink on comparative 3D printed part 2 are indicated on FIG. 4B.

Figure 5A:
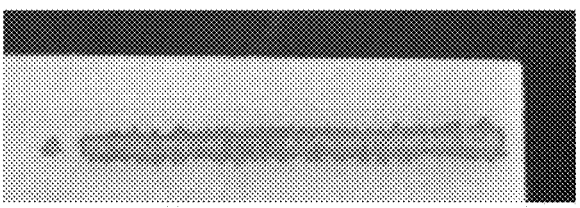
FIG. 5A is an image of another comparative 3D printed part.
Figure 5B:
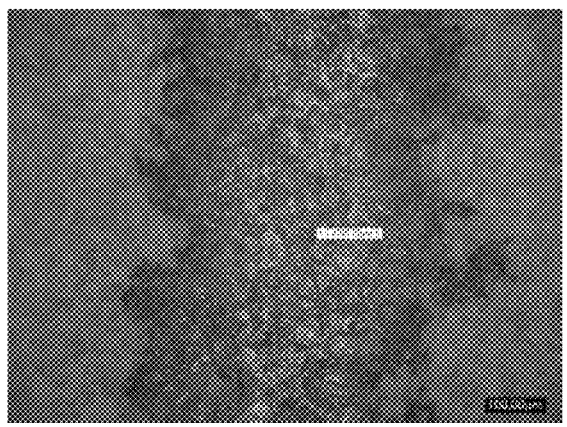
FIG. 5B is a microscopic image of a portion of the comparative 3D printed part shown in FIG. 5A.

Comparative 3D printed part 3 was prepared by spray coating an ink optimizer solution (GOY92A manufactured by Hewlett-Packard Company) onto the selective laser sintered substrate to form a pre-treatment coating. The silver ink was printed on the ink optimizer pre-treatment coating. The printed silver ink on comparative 3D printed part 3 had a line width of about 1545 µm, and a multimeter reading of the printed silver ink on comparative 3D printed part 3 indicated an open circuit. These measurements indicate that comparative 3D printed part 3 has poor print quality (too much bleed) and is not conductive. FIG. 5A shows an image of comparative 3D printed part 3, and FIG. 5B shows a magnified image, using a scalar bar of 100.00 µm, of comparative 3D printed part 3. The line width of the printed ink on comparative 3D printed part 3 is indicated on FIG. 5B.

Figure 6A:
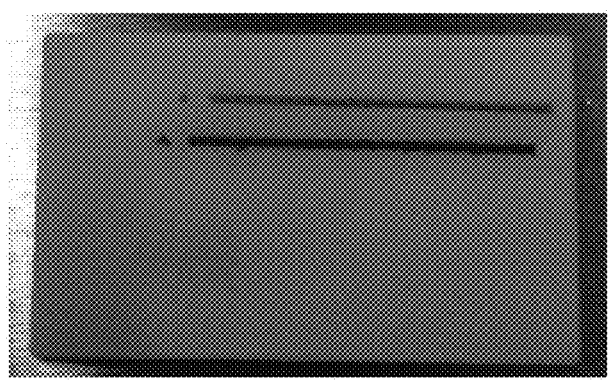
FIG. 6A is an image of another comparative 3D printed part.
Figure 6B:
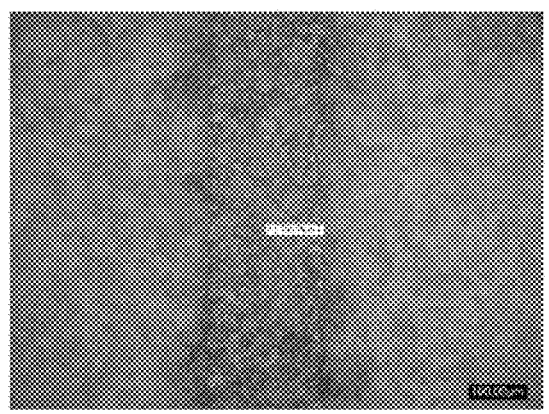
FIG. 6B is a microscopic image of a portion of the comparative 3D printed part shown in FIG. 6A.

Comparative 3D printed part 4 was prepared by spray coating and drying a 1% poly(allylamine)hydrochloride (number average molecular weight of 70,000) aqueous solution onto the selective laser sintered substrate to form a pre-treatment coating. The ink was printed on the poly(allylamine)hydrochloride pre-treatment coating. The printed ink on comparative 3D printed part 4 had a line width of about 700 µm, and a multimeter reading of the printed ink on comparative 3D printed part 4 indicated an open circuit. These measurements indicate that while comparative 3D printed part 4 has good print quality (little bleed), comparative 3D printed part 4 is not conductive. FIG. 6A shows an image of comparative 3D printed part 4, and FIG. 6B shows a magnified image, using a scalar bar of 100.00 µm, of comparative 3D printed part 4. The line width of the printed ink on comparative 3D printed part 4 is indicated on FIG. 6B.

Figure 7A:
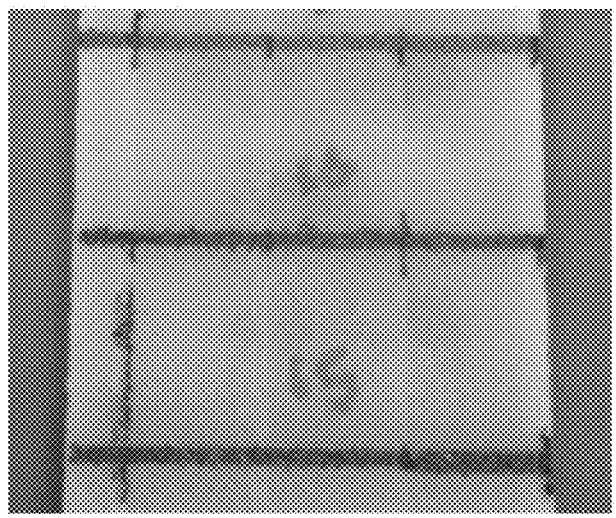
FIG. 7A is an image of an example 3D printed part.
Figure 7B:
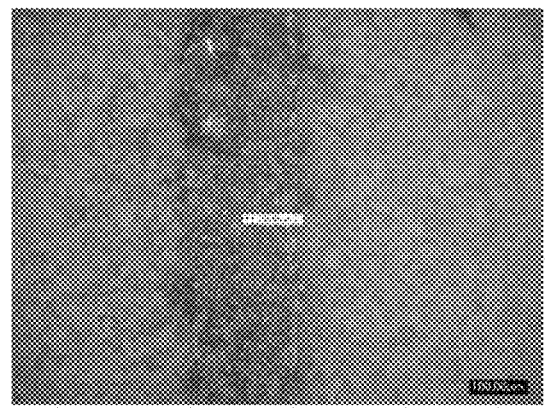
FIG. 7B is a microscopic image of a portion of the example 3D printed part shown in FIG. 7A.

Example 3D printed part 1 was prepared by spray coating and drying, alternatingly the aqueous solution of 1% poly(allylamine) and the aqueous solution of 1% poly(sodium 4-styrenesulfonate) onto the selective laser sintered substrate to form the pre-treatment coating (i.e., a first polycation layer on the substrate, a polyanion layer on the first polycation layer, and a second polycation layer on the polyanion layer). The ink was printed on the pre-treatment coating in 5 passes in sample area 1 (top line in FIG. 7A), in 10 passes in sample area 2 (middle line in FIG. 7A), and 15 passes in sample area 3 (bottom line in FIG. 7A). The printed ink on example 3D printed part 1 in sample area 1 had a line width of about 702 µm. A multimeter measured 8 MΩ of resistance at sample area 1, measured 165Ω of resistance at sample area 2, and measured 110Ω of resistance at sample area 3. These measurements indicate that example 3D printed part 1 has good print quality (little bleed) and is conductive. FIG. 7A shows an image of example 3D printed part 1, and FIG. 7B shows a magnified image, using a scalar bar of 100.00 μm, of example 3D printed part 1. The line width of the printed ink on example 3D printed part 1 in sample area 1 is indicated on FIG. 7B.

Figure 8A:
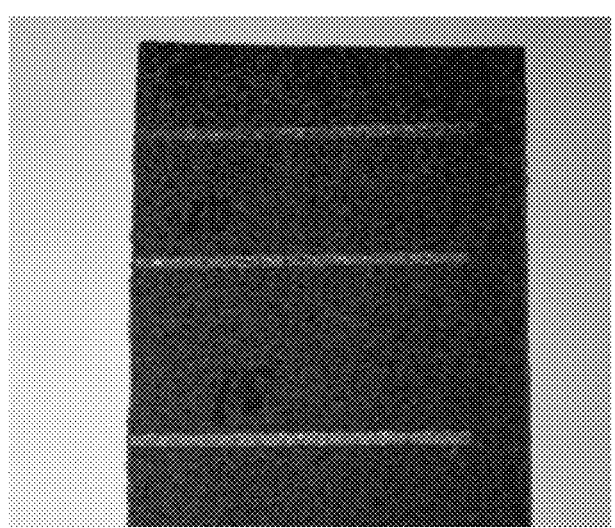
FIG. 8A is an image of another example 3D printed part.
Figure 8B:
FIG. 8B is a microscopic image of a portion of the example 3D printed part shown in FIG. 8A.

Example 3D printed part 2 was prepared by spray coating and drying, alternatingly the aqueous solution of 1% poly (allylamine) and the aqueous solution of 1% poly(sodium 4-styrenesulfonate) onto the multi jet fused substrate to form the pre-treatment coating (i.e., a first polycation layer on the substrate, a polyanion layer on the first polycation layer, and a second polycation layer on the polyanion layer). The ink was printed on the pre-treatment coating in 5 passes in sample area 1 (top line in FIG. 8A), in 10 passes in sample area 2 (middle line in FIG. 8B), and 15 passes in sample area 3 (bottom line in FIG. 8A). The printed ink on example 3D printed part 2 in sample area 1 had a line width of about 722 μm. A multimeter measured 144 kΩ of resistance at sample area 1, measured 1.3 MΩ of resistance at sample area 2, and measured 14 MΩ of resistance at sample area 3. These measurements indicate that example 3D printed part 2 has good print quality (little bleed) and is conductive. FIG. 8A shows an image of example 3D printed part 2, and FIG. 8B shows a magnified image, using a scalar bar of 100.00 μm, of example 3D printed part 2. The line width of the printed ink on example 3D printed part 2 in sample area 1 is indicated on FIG. 8B.

Figure 9:
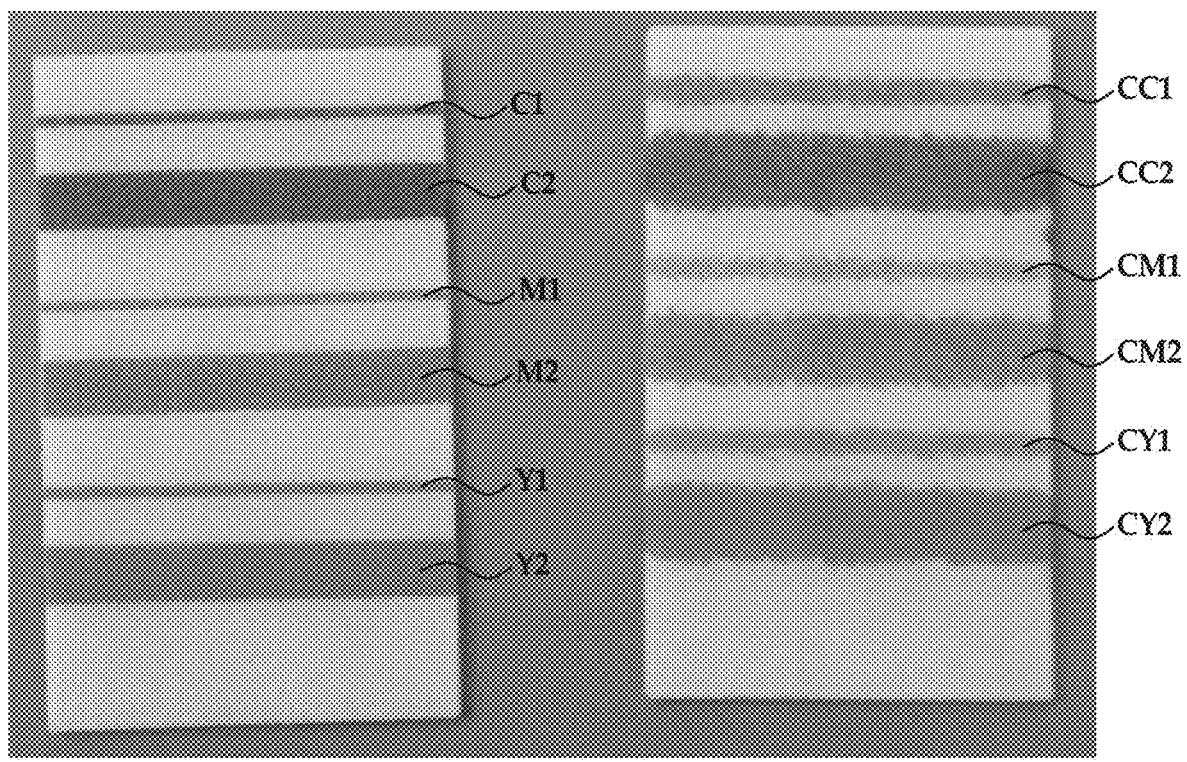
FIG. 9 is an image of another example 3D printed part (left) and another comparative 3D printed part (right).

Comparative 3D printed part 5 was prepared by printing the cyan, magenta, and yellow inks directly onto a commercially available, Nylon PA12, selective laser sintered substrate (manufactured by Stratasys). No pre-treatment coating was present on the substrate. The right substrate in FIG. 9 is an image of comparative 3D printed part 5. The cyan ink was printed on the substrate in sample area 1 (top two lines, CC1, CC2, of the right substrate in FIG. 9), The magenta ink was printed on the substrate in sample area 2 (middle two lines, CM1, CM2, of the right substrate in FIG. 9). The yellow ink was printed on the substrate in sample area 3 (bottom two lines, CY1, CY2, of the right substrate in FIG. 9). The top cyan line CC1 of comparative 3D printed part 5 in sample area 1 had a line width of about 1843 μm and a saturation of 0.69. The top magenta line CM1 of comparative 3D printed part 5 in sample area 2 had a line width of about 1544 μm and a saturation of 0.87. The top yellow line CY1 of comparative 3D printed part 5 in sample area 3 had a line width of about 1619 μm and a saturation of 0.80. These measurements, along with the visual of the thicker lines, indicate that comparative 3D printed part 5 had poor print quality (too much bleed and low saturation).

Example 3D printed part 3 was prepared by spray coating and drying, alternatingly the aqueous solution of 1% poly (allylamine) and the aqueous solution of 1% poly(sodium 4-styrenesulfonate) onto a commercially available, Nylon PA12, selective laser sintered substrate (manufactured by Stratasys) to form the pre-treatment coating (i.e., a first polycation layer on the substrate, a polyanion layer on the first polycation layer, and a second polycation layer on the polyanion layer). The left substrate in FIG. 9 is an image of example 3D printed part 3. The cyan ink was printed on the pre-treatment coating in sample area 1 (top two lines, C1, C2, of the left substrate in FIG. 9). The magenta ink was printed on the pre-treatment coating in sample area 2 (middle two lines, M1, M2, of the left substrate in FIG. 9). The yellow ink was printed on the pre-treatment coating in sample area 3 (bottom two lines, Y1, Y2, of the right substrate in FIG. 9). The top cyan line C1 of example 3D printed part 3 in sample area 1 had a line width of about 724 μm and a saturation of 0.83. The top magenta line M1 of example 3D printed part 3 in sample area 2 had a line width of about 682 μm and a saturation of 1.18. The top yellow line Y1 of example 3D printed part 3 in sample area 3 had a line width of about 778 μm and a saturation of 0.99. The line width of each colored ink (cyan, magenta, and yellow) printed on example 3D printed part 3 were thinner when compared to the line widths of the colored inks (cyan, magenta, and yellow) printed on comparative printed part 5. Additionally, the saturation of each colored ink (cyan, magenta, and yellow) printed on example 3D printed part 3 was greater when compared to the saturation of the colored inks (cyan, magenta, and yellow) printed on comparative 3D printed part 5. These measurements, along with the visual of the thicker lines, indicate that example 3D printed part 3 had good print quality (little bleed and high saturation).

The colored inks may also be printed on multi jet fused substrates.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range. For example, a range from about 50° C. to about 400° C. should be interpreted to include not only the explicitly recited limits of about 50° C. to about 400° C., but also to include individual values, such as 57° C., 95° C., 225° C., 350° C., etc., and sub-ranges, such as from about 70° C. to about 325° C., from about 60° C. to about 170° C., etc. Furthermore, when "about" is utilized to describe a value, this is meant to encompass minor variations (up to +/−10%) from the stated value.

In describing and claiming the examples disclosed herein, the singular forms "a", "an", and "the" include plural referents unless the context clearly dictates otherwise.

While several examples have been described in detail, it is to be understood that the disclosed examples may be modified. Therefore, the foregoing description is to be considered non-limiting.

What is claimed is:

1. A three-dimensional (3D) printing method, comprising:
    forming a pre-treatment coating on a part precursor by applying and drying, alternatingly: i) a polycation solution including a chloride ion; and ii) a polyanion solution including a sodium ion to form at least two layers, wherein drying occurs at a temperature ranging from about 50° C. to about 185° C.; and
    selectively depositing an ink on the pre-treatment coating, wherein the ink forms an outermost layer on the part precursor.

2. The 3D printing method as defined in claim 1, further comprising forming the part precursor by:
    selectively applying a fusing agent on at least a portion of a build material; and
    exposing the build material to radiation, thereby fusing the at least the portion of the build material in contact with the fusing agent.

3. The 3D printing method as defined in claim 1, further comprising forming the part precursor by selective laser sintering.

4. The 3D printing method as defined in claim 1 wherein:
the polycation solution including the chloride ion is selected from the group consisting of a primary amine hydrochloride and a secondary amine hydrochloride; and
the polyanion solution including the sodium ion is selected from the group consisting of a sodium carboxylate, a sodium sulfonate, and a sodium phosphonate.

5. The 3D printing method as defined in claim 1 wherein the ink is a conductive ink.

6. The 3D printing method as defined in claim 1 wherein the applying of the polycation solution and the applying of the polyanion solution are accomplished by thermal inkjet printing, piezo electric inkjet printing, dip coating, painting, or spray coating.

7. The 3D printing method as defined in claim 2 wherein the build material is a polymeric powder or a composite of a polymeric powder and ceramic particles.

8. The 3D printing method as defined in claim 2 wherein the fusing agent includes an active material selected from the group consisting of carbon black and a near infrared dye.

9. The 3D printing method as defined in claim 3 wherein the selective laser sintering involves aiming a laser beam at a selected region of a layer of a build material.

10. The 3D printing method as defined in claim 5 wherein the conductive ink includes a conductive material, a co-solvent, a dispersant, an anti-kogation agent, and water.

11. The 3D printing method as defined in claim 10 wherein the conductive material is selected from the group consisting of silver, copper, zinc, a metal alloy, a metal oxide, metal coated oxide, cadmium selenide, metal coated silica, carbon black, and a carbon analog.

12. The 3D printing method as defined in claim 1, wherein the part precursor includes fused polyamide build material.

* * * * *